United States Patent
Rangarajan et al.

(10) Patent No.: US 6,602,727 B1
(45) Date of Patent: Aug. 5, 2003

(54) SCATTEROMETRY BASED ACTIVE CONTROL OF EXPOSURE CONDITIONS

(75) Inventors: Bharath Rangarajan, Santa Clara, CA (US); Bhanwar Singh, Morgan Hill, CA (US); Ramkumar Subramanian, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/133,874

(22) Filed: Apr. 26, 2002

Related U.S. Application Data
(60) Provisional application No. 60/286,940, filed on Apr. 27, 2001.

(51) Int. Cl.$^7$ .............................................. H01L 21/66
(52) U.S. Cl. ............................. 438/14; 355/55; 355/63; 355/53
(58) Field of Search .............................. 438/14; 455/55, 455/63, 52, 54, 61, 62, 67, 69, 53

(56) References Cited

U.S. PATENT DOCUMENTS

| | | | |
|---|---|---|---|
| 4,908,656 A | * | 3/1990 | Suwa et al. |
| 5,343,293 A | | 8/1994 | Berger et al. |
| 5,880,838 A | | 3/1999 | Marx et al. |
| 5,978,071 A | * | 11/1999 | Miyajima et al. |
| 6,052,188 A | | 4/2000 | Fluckiger et al. |
| 6,104,486 A | | 8/2000 | Arimoto |
| 6,501,534 B1 | * | 12/2002 | Singh et al. |

OTHER PUBLICATIONS

Scatterometry for the Measurement of Metal Features, In Metrology, Inspection, and Process Control for Microlithography XIV, Christopher J. Raymond, Steve W. Farrer and Scott Sucher Proceedings of SPIE, vol. 3998 (2000), pp. 135–145.

Manufacturing Considerations for Implementation of Scatterometry for Process Monitoring, In Metrology, Inspection, and Process Control for Microlighography XIV, John Allgair, Dave Benoit, Rob Hershey and Lloyd C. Litt (Motorola); Ibrahim Abdulhalim, Bill Braymer, Michael Faeyrman, John C Robinson, Umar Whitney, Yiping Xu, Piotr Zalicki and Joel Seligson (KLA–Tencro Corp.), Proceedings of SPIE, vol. 3998 Feb. (2000), pp. 134.

Phase Profilometry for the 193 nm Lithography Gate Stack, In Metrology, Inspection, and Process Control for Microlighography XIV, Nickhil Jakatdar, Xinhui Niu, Junwei Bao, Costas Spanos, Sanjay Yedur and Alain Deleporte, Proceedings of SPIE, vol. 3998 Feb. (2000), pp. 116–124.

(List continued on next page.)

*Primary Examiner*—Long Pham
(74) *Attorney, Agent, or Firm*—Eschweiler & Associates LLC

(57) ABSTRACT

A system for regulating an exposure condition determining process is provided. The system includes one or more light sources, each light source directing light to one or more gratings exposed on one or more portions of a wafer. Light reflected from the gratings is collected by a measuring system, which processes the collected light. Light passing through the gratings may similarly be collected by the measuring system, which processes the collected light. The collected light is analyzed to determine whether exposure conditions should be adapted prior to exposing a pattern on the wafer. The measuring system provides grating signature data to a processor that determines the acceptability of the exposure condition by comparing determined signatures to desired signatures. The system also includes an exposing system that can be controlled to change exposure conditions. The processor selectively controls the exposing system, via the exposer driving system, to adapt such exposure conditions.

10 Claims, 16 Drawing Sheets

OTHER PUBLICATIONS

Lithographic Process Monitoring using Diffraction Measurements, Metrology, Inspection, and Process Control for Microlithography XIV, Emmanuel M. Drege and Dale M. Byrne, Proceedings of SPIE, vol. 3998 Feb. (2000), 12 pp.
An Integrated System of Optical Metrology for Deep Sub-Micron Lithography, Xinhui Niu, A dissertation submitted in partial satisfaction of the requirements for the degree of Doctor of Philosphy in Engineering–Electrical Engineering and Computer Sciences in the Graduate Division of the University of California, Berkeley, Spring, 1999, 153 pp., Call #308t, 1999, 324.

* cited by examiner

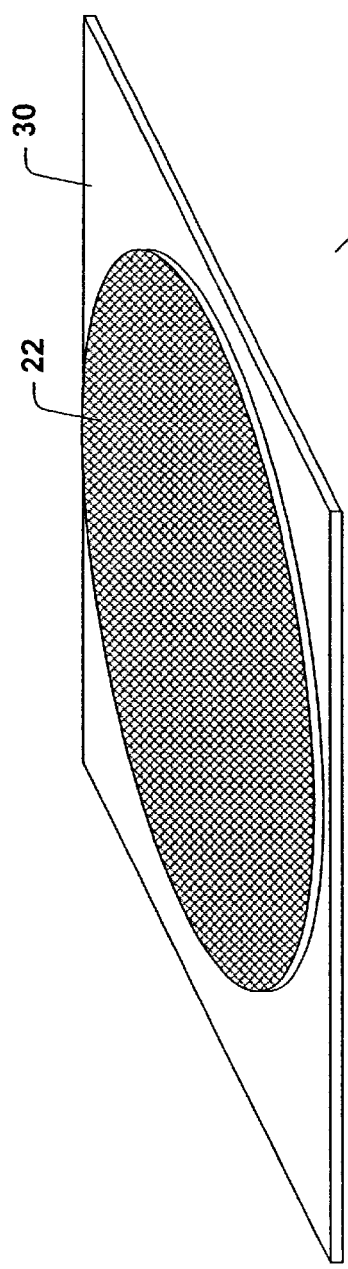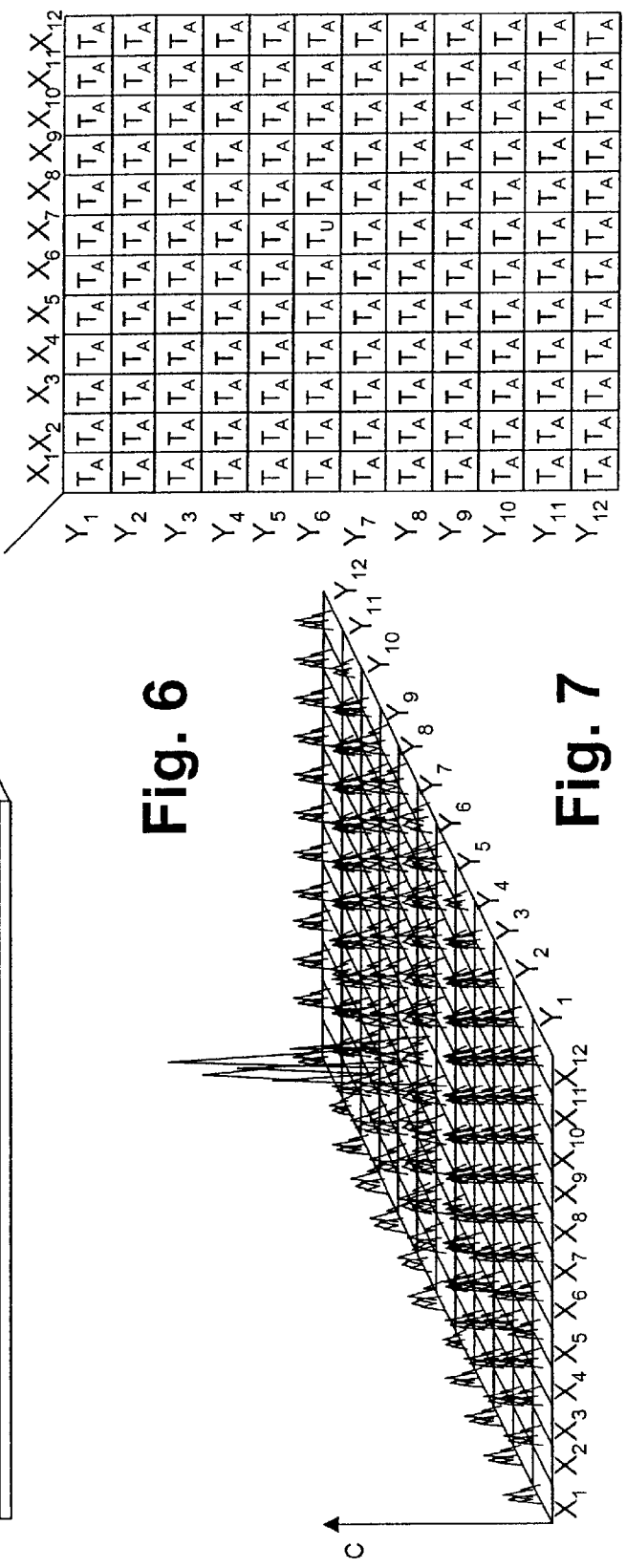
Fig. 6
Fig. 7
Fig. 8

SCATTEROMETRY BASED ACTIVE CONTROL OF EXPOSURE CONDITIONS

RELATED APPLICATION

This application claims priority to Serial No. 60/286,940 filed Apr. 27, 2001, which is entitled "Scatterometry Based Active Control of Pre-Exposure Conditions".

TECHNICAL FIELD

The present invention relates generally to semiconductor processing, and in particular to a system for adjusting exposure conditions before exposing a pattern on a wafer layer.

BACKGROUND

In the semiconductor industry, there is a continuing trend toward higher device densities. To achieve these high densities there have been, and continue to be, efforts toward scaling down device dimensions (e.g., at sub-micron levels) on semiconductor wafers. In order to accomplish such high device packing densities, smaller and smaller features sizes are required. This may include the width and spacing of interconnecting lines, spacing and diameter of contact holes, and the surface geometry, such as coiners and edges, of various features. When feature sizes become smaller, ensuring that pattern exposure conditions will produce a pattern with desired critical dimensions on a wafer becomes more important.

The process of manufacturing semiconductors, or integrated circuits (commonly called ICs, or chips), typically consists of more than a hundred steps, during which hundreds of copies of an integrated circuit may be formed on a single wafer. Generally, the process involves creating several patterned layers on and into the substrate that ultimately forms the complete integrated circuit. This layering process creates electrically active regions in and on the semiconductor wafer surface. The precision with which the electrically active regions can be created is important in achieving desired critical dimensions in the chips. Such precision is affected by the ability to control pattern exposure conditions. If the exposure conditions are such that exposing a pattern will not produce desired critical dimensions, then the electrically active regions may not operate together properly, thus reducing chip manufacturing efficiency and chip quality. Exposure conditions including focus depth, focus width and dose can effect such the critical dimensions that will be achieved when a pattern is exposed.

The requirement of small features with close spacing between adjacent features requires sophisticated manufacturing techniques, including high-resolution photolithographic processes, and calculating exposure conditions before exposing a pattern. Fabricating a semiconductor using such sophisticated techniques may involve a series of steps including cleaning, thermal oxidation or deposition, exposure condition, masking, developing, baking and doping of several layers, each of which must be formed properly to achieve desired critical dimensions. One or more patterns may be exposed on several layers formed (e.g., deposited and/or grown) on a wafer. Each such pattern may be affected by variations in a wafer (e.g., center to edge variations). Thus, exposure conditions (e.g., focus, dose) that can be employed to expose a first pattern on a first layer and achieve acceptable critical dimensions, may not be similarly achieve acceptable critical dimensions for a second pattern on a second layer. Uniformity of critical dimensions between layers can improve IC quality leading to higher clocking speeds and resulting improved performance for such ICs.

Wafers may be pre-cleaned using, for example, high-purity, low-particle chemicals. The silicon wafers may be heated and exposed to ultra-pure oxygen in diffusion furnaces under carefully controlled conditions to form a silicon dioxide film of uniform thickness on the surface of the wafer. The masking step is used to protect one area of the wafer while working on another. This process is referred to as photolithography or photo masking. A photo resist, or light-sensitive film, is applied to the wafer, giving it characteristics similar to a piece of photographic paper. A photo aligner aligns the wafer to a mask, and then projects an intense light through the mask and through a series of reducing lenses, exposing the photo resist with the mask pattern. The intensity of the light, the length of exposure, and the focusing of the lens affect the ability to achieve critical dimensions for a chip. Conventionally, the exposure condition calculation process has not been feedback controlled, requiring pre-calculated exposure condition steps and/or layer specific exposure condition calculation processes. Such pre-determined calculations may not produce exposure conditions that will yield desired critical dimensions, resulting in patterns that do not implement desired features within acceptable tolerances.

The portions of the light sensitive resist layer exposed to the light harden (for certain types of resist), facilitating removal of the non-hardened portions. If the exposure condition determinations prior to exposing a layer to light are not precise enough, an undesired portion of the light sensitive resist layer may be exposed to the light, disabling desired feature creation. After the exposed resist has hardened, the non-hardened portions are removed, exposing the oxide layer or other underlying layer previously deposited. Again, if the exposure condition determinations prior to exposure were not precise enough, an undesired portion of the oxide may be unprotected and thus may be removed during the etching process. The portions of the oxide layer not protected by the hardened resist layer may now be etched away, by, for example, a chemical solution or plasma gas discharge. The hardened photo resist is then removed using additional chemicals or plasma and the wafer is then inspected to ensure the image transfer from the mask to the top layer is correct.

Due to the extremely fine patterns that are exposed on the photo resist, controlling the exposure condition determining process is a significant factor in achieving desired critical dimensions. Thus, an efficient system and/or method to monitor and control the exposure condition determination process is desired to increase fidelity in image transfer.

SUMMARY

The following presents a simplified summary of the invention in order to provide a basic understanding of some aspects of the invention. This summary is not an extensive overview of the invention. It is not intended to identify key or critical elements of the invention nor is it intended to delineate the scope of the invention. Its sole purpose is to present some concepts of the invention in a simplified form as a prelude to the more detailed description that is presented later.

The present invention provides a system that facilitates controlling an exposure condition determination process involved in semiconductor manufacturing. Controlling the exposure conditions with runtime feedback provides superior exposure condition calculations and thus facilitates achieving desired critical dimensions, with substantial uniformity in such critical dimensions between layers. An exemplary system may employ an exposing system that includes one or more light sources arranged to project light onto one or more gratings on one or more portions of a wafer. The system may also include one or more light sensing devices (e.g., photo detector, photodiode) for detecting light reflected by, and/or allowed to pass through, the one or more gratings. The light reflected from, and/or passing through the one or more gratings is indicative of at least one parameter of the exposure condition process (e.g., focus depth, focus width, dose).

An exposing system is arranged to facilitate projecting a pattern onto a layer on a wafer. The exposing system may be, for example, a light and lens combination found in a stepper apparatus. It is to be appreciated by one skilled in the art that any suitable exposing system can be employed with the present invention. The exposing system is selectively controllable by the system to change exposure conditions including, but not limited to, focus, phase, intensity and dose. The exposure condition determinations are adapted by the system by comparing signatures generated by the light reflected and/or passed through the gratings pre-formed on the layers on a wafer to desired signatures. By comparing desired signatures to measured signatures, runtime feedback may be employed to more precisely determine exposure conditions that will facilitate achieving desired critical dimensions in the pattern to be developed on the wafer and as a result, more optimal exposure conditions are achieved, which in turn increases fidelity of image transfer. The increased fidelity can lead to achieving desired critical dimensions, and can further lead to substantial uniformity of critical dimensions between layers, which in turn facilitates achieving higher speeds in such chips.

An aspect of the present invention provides a system for analyzing and controlling pattern exposure conditions in semiconductor manufacturing. The system includes an exposing system that projects a pattern onto a wafer. The system also includes an exposer driving system that can control one or more exposure conditions in the exposing system. The exposure conditions are adapted based on signatures read from gratings formed on the wafer. The signatures can be read by the operation of a light directing system that direct light to at least one portion of the wafer and a measuring system that measures grating signatures based on light reflected from a grating. The system further includes a processor operatively coupled to the measuring system and the exposer driving system. The processor receives grating signature data from the measuring system and uses the grating signature data to control the exposer to adapt exposure conditions.

Another aspect of the present invention provides a method for analyzing and controlling pattern exposure conditions in a stepper. The method includes partitioning a wafer into portions; developing gratings in the portions; directing light onto at least one of the gratings; collecting light reflected from the grating; analyzing the reflected light to facilitate retrieving a signature associated with the grating; and controlling an exposer to adjust one or more pattern exposure conditions based on comparisons between the determined signature and a desired signature.

Yet another aspect of the present invention provides a method for regulating an exposure condition calculating process. The method includes partitioning a wafer into grid blocks; pre-exposing gratings on the wafer, the gratings positioned within the grid blocks; controlling an exposing system to maintain and/or change exposure conditions; determining the acceptability of the exposure conditions by analyzing the gratings pre-formed on the wafer; generating feedback information concerning the acceptability of the exposure conditions; transmitting the feedback information to a processor; and using the processor to coordinate control of the exposing system based, at least in part, on the feedback information.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIG. 6 is a perspective illustration of a substrate (including photo resist) that may be etched in accordance with an aspect of the present invention.

FIG. 7 is a representative three-dimensional grid map of a wafer illustrating grating signature measurements taken at grid blocks of the grid map in accordance with an aspect of the present invention.

FIG. 8 is a grating signature measurement table correlating the grating signatures of FIG. 7 with desired grating signatures in accordance with the present invention.

DETAILED DESCRIPTION

In the following description, for purposes of explanation, numerous specific details are set forth in order to provide a thorough understanding of the present invention. It will be evident to one skilled in the art, however, that the present invention may be practiced without these specific details. In other instances, wellknown structures and devices are shown in block diagram form in order to facilitate description of the present invention.

As used in this application, the term "component" is intended to refer to a computer-related entity, either hardware, a combination of hardware and software, software, or software in execution. For example, a component may be, but is not limited to being, a process running on a processor, a processor, an object, an executable, a thread of execution, a program, a set of co-operating computers and/or processes and a computer.

It is to be appreciated that various aspects of the present invention may employ technologies associated with facilitating unconstrained optimization and/or minimization of error costs. Thus, non-linear training systems/methodologies (e.g., back propagation, Bayesian, fuzzy sets, non-linear regression, or other neural networking paradigms including mixture of experts, cerebella model arithmetic computer (CMACS), radial basis functions, directed search networks and function link networks may be employed.

Figure 1:
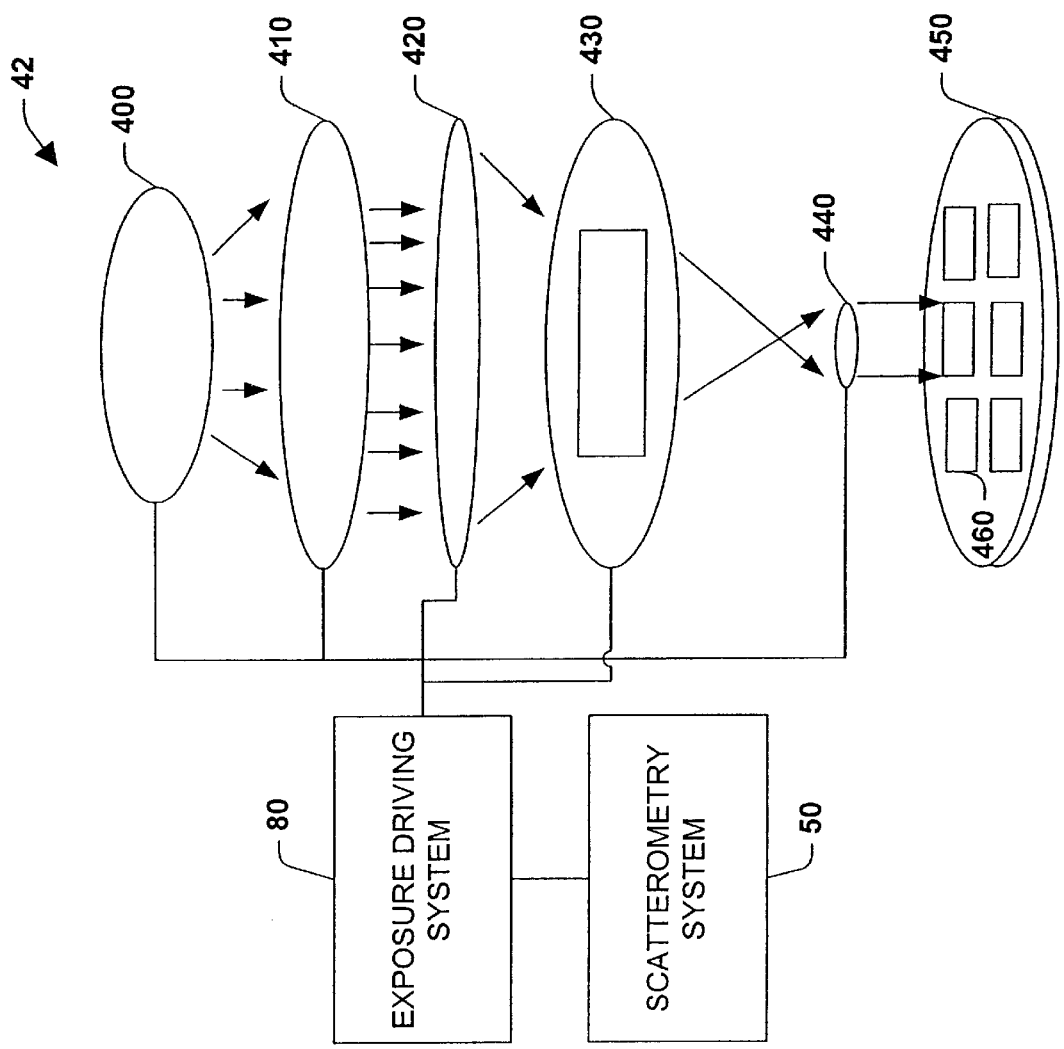
FIG. 1 is a schematic block diagram of an exposing system employed in accordance with an aspect of the present invention.

Referring initially to FIG. 1, an exposing system 42 is illustrated. The system 42 includes an illumination source 400. An illumination produced by the illumination source 400 can be controlled by modulating power supplied to the illumination source 400. The exposing system 42 can also include an illumination modification filter 410, (e.g., a pupil filter) which can be employed to modulate the intensity and/or phase of light spatially. The exposing system 42 can also include a lens system 420 and a lens system 440, each of which can be positionally controlled (e.g., vertically) to adjust a focus of a light passing through the lens system 420 and the lens system 440. The exposing system 42 can also include a mask/reticle 430, which can be employed to expose a pattern 460 on a wafer 450. One or more of the illumination source 400, the illumination modification filter 410, the lens system 420, the mask/reticle 430 and the lens system 440 can be operably connected to an exposure driving system 80. The exposure driver system 80 can be operably connected to a scatterometry system 50 such that the scatterometry system 50 can provide feedback information concerning the formation of the one or more patterns 460 on the wafer 450. Such feedback information can be employed to control one or more of the illumination source 400, the illumination modification filter 410, the lens system 420, the mask/reticle 430 and the lens system 440. By way of illustration, the feedback information can be employed to modulate the power supplied to the illumination source 400 to alter the exposure conditions to which the wafer 450 is exposed. By way of further illustration, the feedback information can be employed to reposition the illumination modification filter, the lens system 420 and/or the lens system 440, to alter the exposure conditions to which the wafer 450 is exposed.

Figure 2:
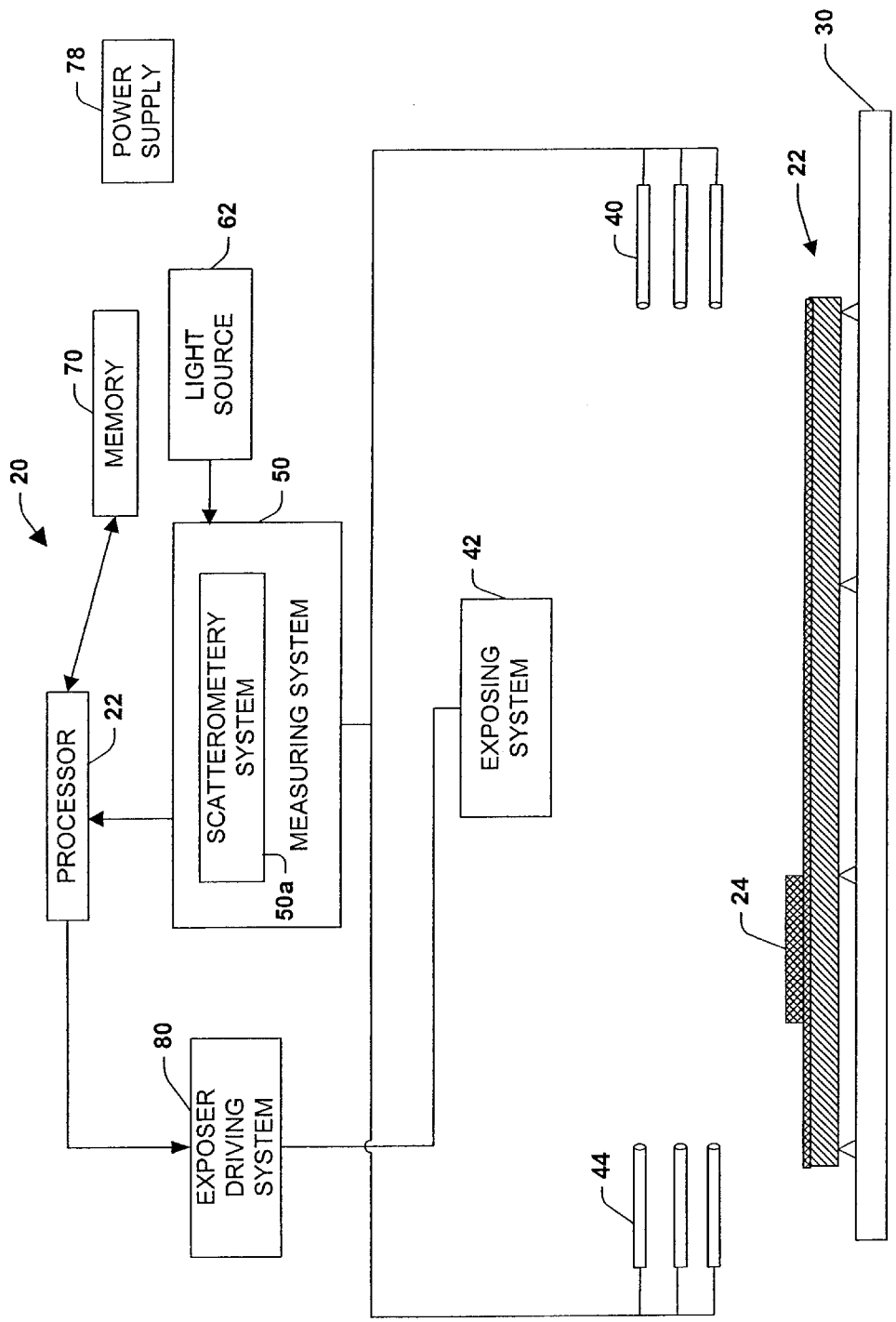
FIG. 2 is schematic block diagram of a exposure condition process monitoring and control system in accordance with an aspect of the present invention.

Turning now to FIG. 2, a system 20 for controlling exposure conditions for a pattern to be developed on a wafer 22 is shown. A grating 24 has been formed on the wafer 22. The grating 24 is formed on the wafer 22 before developing a pattern on the wafer 22 to facilitate adapting exposure conditions to achieve desired critical dimensions in the pattern exposed on the wafer. The system 20 further includes an exposing system 42 that is selectively controlled by the system 20 to facilitate controlling exposure conditions for the pattern to be developed on the wafer 22. The wafer 22 is supported on a chuck 30. Although one grating 24 is illustrated, it is to be appreciated by one skilled in the art that a greater number of gratings may be employed by the present invention.

One or more light sources 44 project light onto respective portions of the wafer 22. The wafer 22 can be partitioned into one or more portions. Each portion of the wafer 22 may have one or more gratings 24 pre-formed thereon. Light reflected, and/or passed through, the one or more gratings 24 is collected by one or more light detecting components 40, and processed by a grating parameter measuring system 50 to measure at least one parameter relating to the exposure condition. For example, a signature associated with the grating 24 may indicate that focus should be adjusted in the exposing system 42. The reflected and/or passed through light is processed with respect to the incident light in measuring the various parameters. The reflected and/or passed through or transmitted light generates signatures associated with the grating 24. The signatures can be used to generate feedback control information that can be employed to control the exposer via the exposer driving system.

The measuring system 50 includes a scatterometry system 50a. It is to be appreciated that any suitable scatterometry system may be employed to carry out the present invention and such systems are intended to fall within the scope of the claims appended hereto. For the sake of brevity, sample scatterometry systems are briefly described in association with FIG. 10 and FIG. 11, and scatterometry is briefly discussed in connection with FIG. 14 through FIG. 19.

A source of light 62 (e.g., a laser) provides light to the one or more light sources 44 via the measuring system 50. Preferably, the light source 62 is a frequency stabilized laser, however, it will be appreciated that any laser or other light source (e.g., laser diode or helium neon (HeNe) gas laser) suitable for carrying out the present invention may be employed. One or more light detecting components 40 (e.g., photo detector, photo diodes) collect light reflecting from or passing through the one or more gratings 24.

A processor 60 receives the measured data from the measuring system 50 and determines whether to adapt the exposure conditions of the exposing system 42 based, at least in part, on comparing the signature measured from the grating 24 pre-formed on the wafer 22 to a desired signature. The processor 60 is operatively coupled to the measuring system 50 and is programmed to control and operate the various components within the system 20 in order to carry out the various functions described herein. The processor, or CPU 60, may be any of a plurality of processors, such as the AMD ATHLON and other similar and compatible processors. The manner in which the processor 60 can be programmed to carry out the functions relating to the present invention will be readily apparent to those having ordinary skill in the art based on the description provided herein. A memory 70, which is operatively coupled to the processor 60, is also included in the system 20 and can store program code executed by the processor 60 for carrying out operating functions of the system 20 as described herein. The memory 70 also serves as a storage medium for temporarily storing information such as grating signatures, exposure condition requirements, grating signature tables, component coordinate tables, grating sizes, grating shapes, scatterometry information, and other data that may be employed in carrying out the present invention.

A power supply 78 provides operating power to the system 20. Any suitable power supply (e.g., battery, line power) may be employed to carry out the present invention. The processor 60 is also coupled to an exposure driving system 80 that drives the exposing system 42. The exposure driving system 80 is controlled by the processor 60 to selectively cause the exposing system 42 to change one or more pattern exposure conditions including, but not limited to, depth of focus, width of field, intensity, phase, and exposure dose. The processor 60 monitors the signatures associated with the pre-formed grating 24 and selectively regulates exposure conditions of the exposing system 42. As a result, the system 20 provides for regulating the conditions under which a pattern will be exposed on the wafer 22, which in turn improves fidelity of image transfer in a lithographic process. Improved image transfer fidelity facilitates achieving desired critical dimensions and thus smaller feature sizes and higher packing densities. Achieving substantially similar desired critical dimensions for different patterns on different layers improves IC quality, and facilitates higher speeds for such chips.

Figure 3:
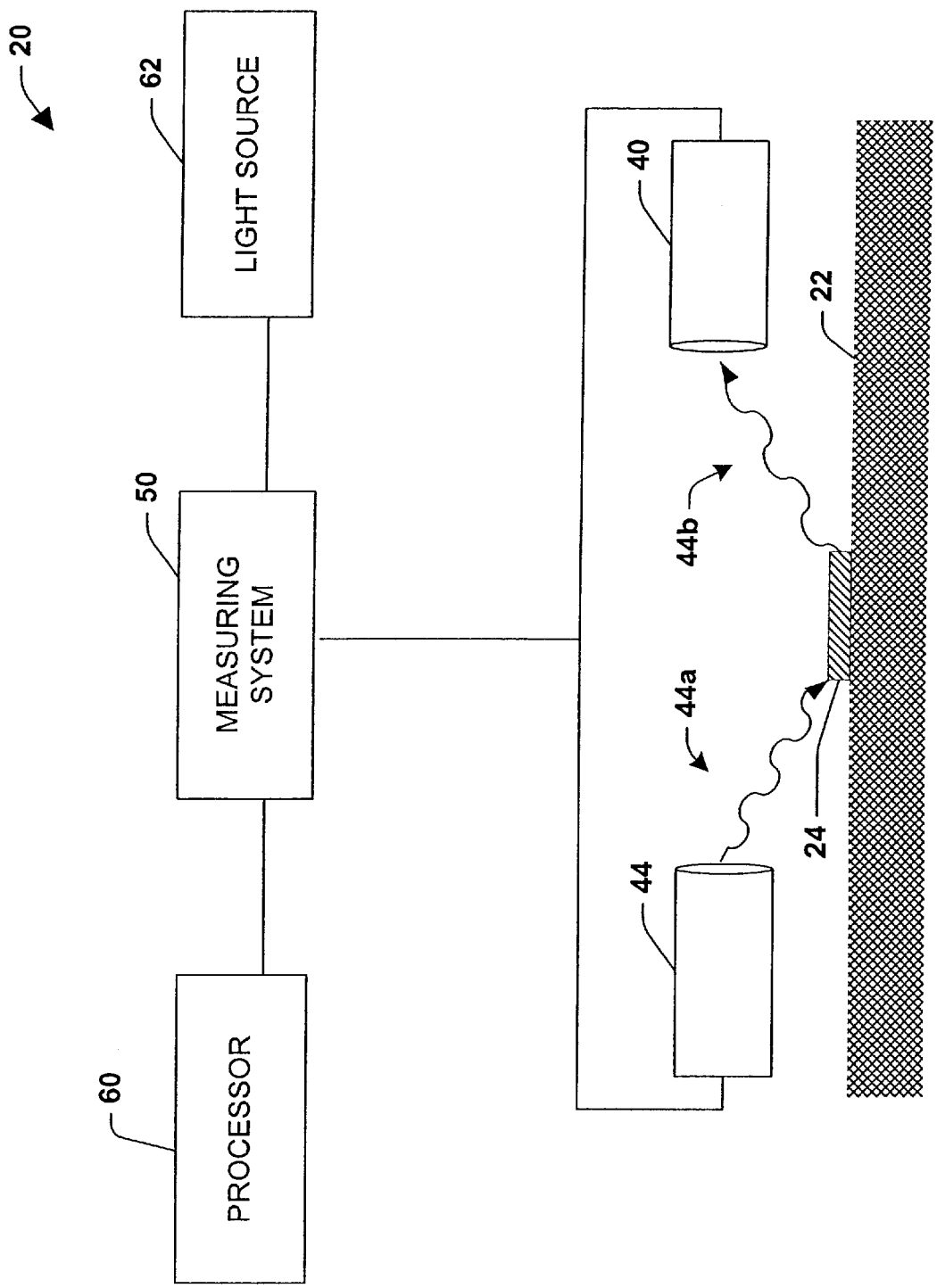
FIG. 3 is a partial schematic block diagram of the system of FIG. 2 being employed in connection with determining an exposure condition by measuring a grating signature in accordance with the an aspect of present invention.

FIG. 3 illustrates the system 20 being employed to generate a signature for a grating 24 pre-formed on the wafer 22. A light source 44 directs a light 44a incident to the surface of the wafer 22. The angle of a reflected light 44b from the surface of the wafer 22 will vary in accordance with the critical dimensions achieved for the grating 24. The one or more light detecting components 40 collect the reflected light 44b, pass the collected light, and/or data concerning the collected light, to the measuring system 50, which processes the reflected light 44b and/or data concerning the reflected light 44b in accordance with scatterometry techniques to provide the processor 60 with grating signature data. The reflected light 44b can be employed to generate a signature that can be compared to one or more signatures to determine whether the grating 24 has achieved desired critical dimensions and thus, whether one or more exposure conditions should be adapted prior to exposing a pattern onto the wafer 22.

Figure 4:
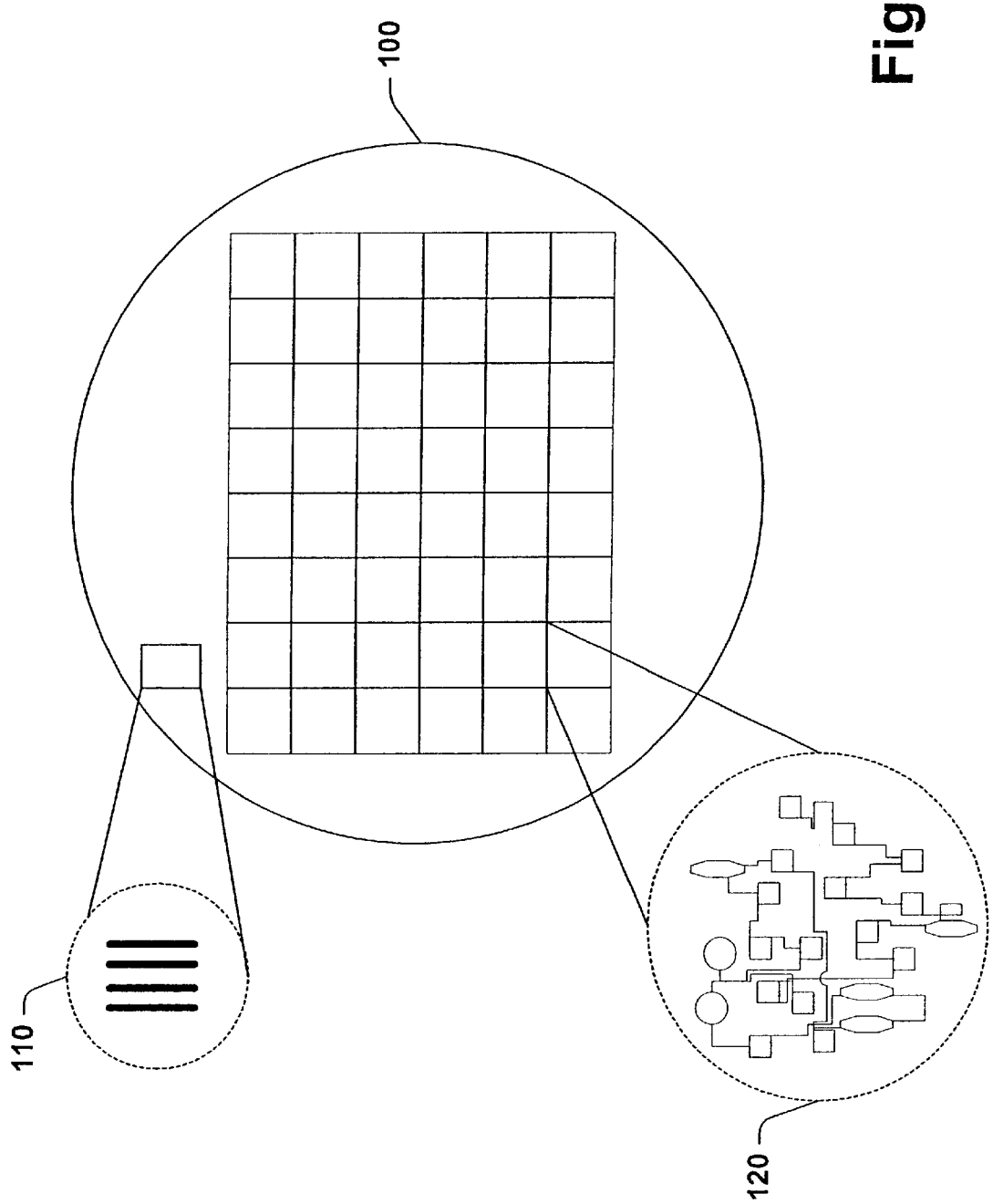
FIG. 4 illustrates a grating pre-formed on a wafer and a pattern to be exposed on a wafer, in accordance with an aspect of the present invention.

Turning now to FIG. 4, a wafer 100 is illustrated with a grating 110 pre-formed on the wafer. A pattern 120 to be exposed on the wafer 100 is also illustrated. Before exposing the pattern 120 onto the wafer 100, the present invention will pre-form one or more gratings 110 onto the wafer 100 and analyze scatterometry signatures associated with such gratings 110. By way of illustration, a first grating 110 may be pre-formed onto the wafer 100. A scatterometry signature can be generated by the present invention. The signature can be analyzed to determine whether exposure conditions should be adapted. Once adaptations have occurred, further iterations of pre-forming one or more gratings 110 and analyzing such pre-formed gratings can occur until a satisfactory grating 110 is produced. Once a satisfactory grating 110 is produced, indicating that exposure conditions are conducive to producing desired critical dimensions in the pattern 120 to be exposed, then the pattern 120 may be exposed.

Figure 5:
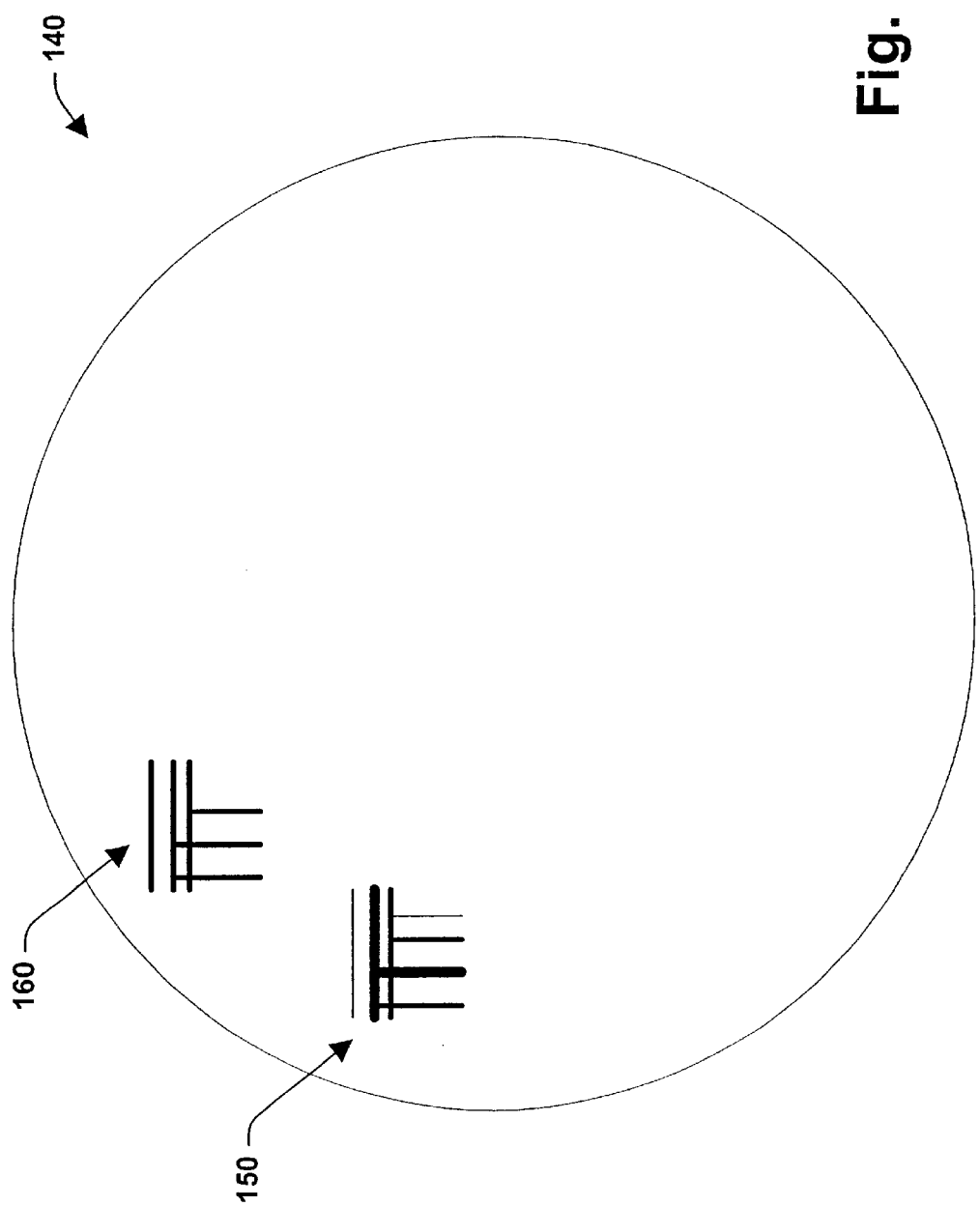
FIG. 5 illustrates a grating that has achieved desired critical dimensions and a grating that has not achieved desired critical dimensions, in accordance with an aspect of the present invention.

Thus, turning to FIG. 5, a wafer 140 is illustrated with a first grating 150 and a second grating 160. The first grating 150 may have been pre-formed using first exposure conditions. The first grating 150 may have been analyzed using scatterometry techniques in accordance with present invention, whereupon the present invention determined to adapt the exposure conditions. Thus, after adapting the exposure conditions, the second grating 160 may have been pre-formed. Scatterometry analysis of the second grating 160 may indicate that desired critical dimensions have been achieved for the grating 160 and thus a pattern can be exposed onto the wafer 140 with greater confidence that desired critical dimensions will be achieved. Generating feedback based on accurate measurements of pre-formed gratings can facilitate achieving substantial uniformity in critical dimensions across a wafer and also between layers on a wafer. Such substantial uniformity leads to higher quality ICs and corresponding improved IC performance.

Turning now to FIGS. 6–8 a chuck 30 is shown in perspective supporting a wafer 22 whereupon one or more gratings 24 (FIG. 2) may be pre-formed. The wafer 22 may be divided into a grid pattern as shown in FIG. 7. Each grid block (XY) of the grid pattern corresponds to a particular portion of the wafer 22, and each grid block has one or more gratings 24 (FIG. 2) associated with that grid block. Each portion is monitored individually for signatures generated by the gratings 24 (FIG. 2).

In FIG. 7, one or more gratings 24 in the respective portions of the wafer 22 ($X_1Y_1$ . . . $X_{12}, Y_{12}$) are being monitored for signatures using reflective and/or passed through light, the measuring system 50 and the processor 60. The grating signatures for the gratings 24 are shown. It is to be appreciated that although FIG. 7 illustrates the wafer 22 being mapped (partitioned) into 144 grid block portions, the wafer 22 may be mapped with any suitable number of portions and any suitable number of gratings 24 may be employed. Given the set of signatures recorded in FIG. 7, the processor 60 may determine that an undesirable exposure condition exists. Accordingly, the processor 60 may control the exposing system 42 (FIG. 1) to bring the exposure condition to a desired exposure condition. It is to be appreciated that the exposing system 42 (FIG. 1) may be driven so as change pattern exposure conditions including, but not limited to, intensity, phase, focus and dose. When the processor 60 determines that the exposure conditions are acceptable, as determined by analyzing the grating signatures, the processor 60 may terminate adapting the exposure conditions, at which point exposure of the pattern can commence.

FIG. 8 illustrates a table of acceptable and unacceptable grating signatures. It can be seen that all the grating signatures are acceptable except grating signature for grid $X_7Y_6$. The set of grating signatures depicted in FIG. 7 can be analyzed collectively as a master signature, can be analyzed in subsets to evaluate, for example, intermediate alignment and/or may be analyzed individually to determine whether an acceptable alignment condition exists. The analysis of the signatures is used to control the exposure condition component driving system 80 (FIG. 2), so that finer exposure condition may be achieved.

Figure 9:
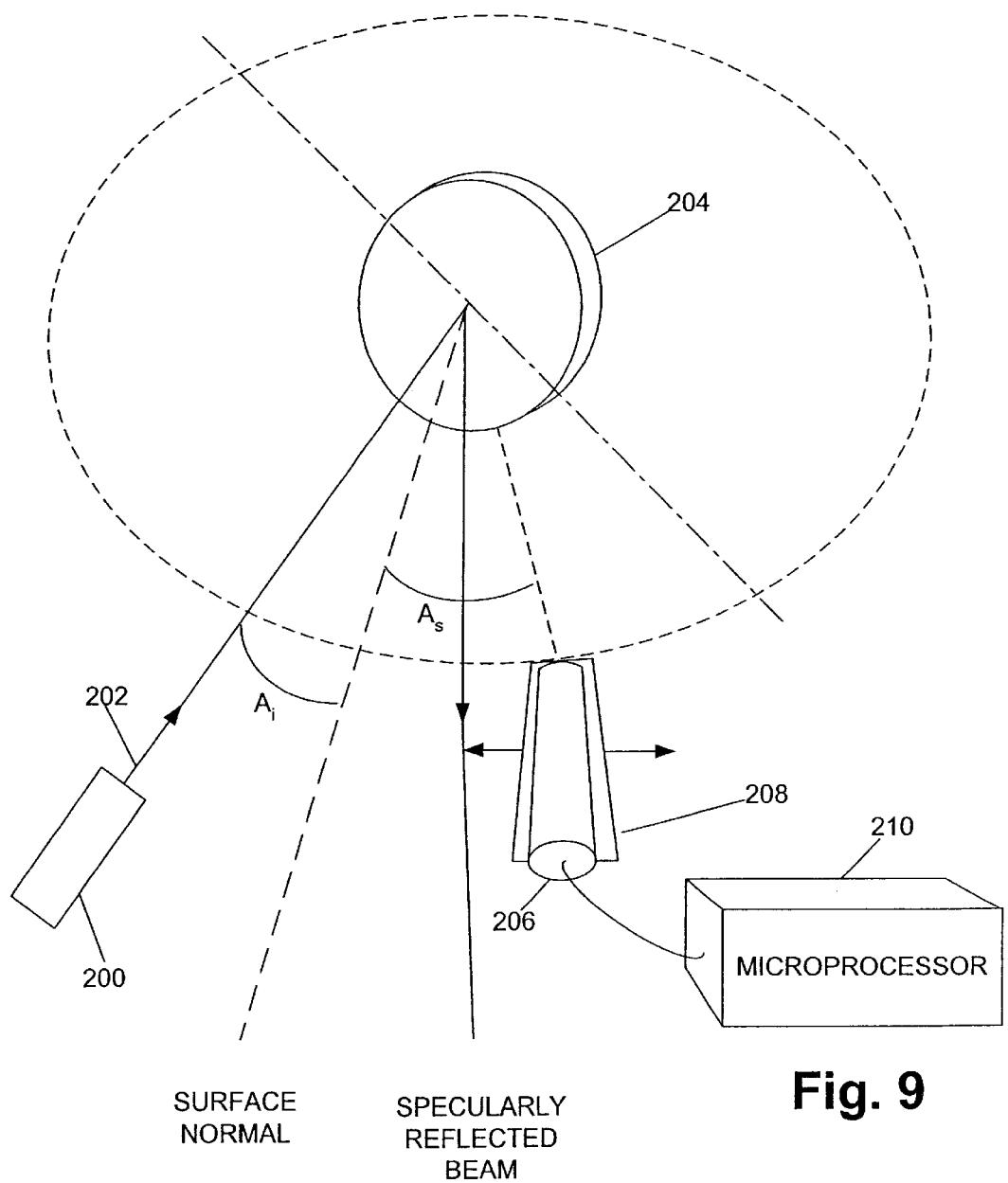
FIG. 9 illustrates an exemplary scatterometry system collecting reflected light.

FIG. 9 illustrates an exemplary scatterometry system collecting reflected light. Light from a laser 200 is brought to focus in any suitable well-known manner to form a beam 202. A sample, such as a wafer 204 is placed in the path of the beam 202 and a photo detector or photo multiplier 206 of any suitable well-known construction. Different detector methods may be employed to determine the scattered power.

To obtain a grating pitch, the photo detector or photo multiplier 206 may be mounted on a rotation stage 208 of any suitable well-known design. A microprocessor 210, of any suitable well-known design, may be used to process detector readouts, including, but not limited to, angular locations of different diffracted orders leading to diffraction grating pitches being calculated. Thus, light reflected from the sample 204 may be accurately measured.

Figure 10:
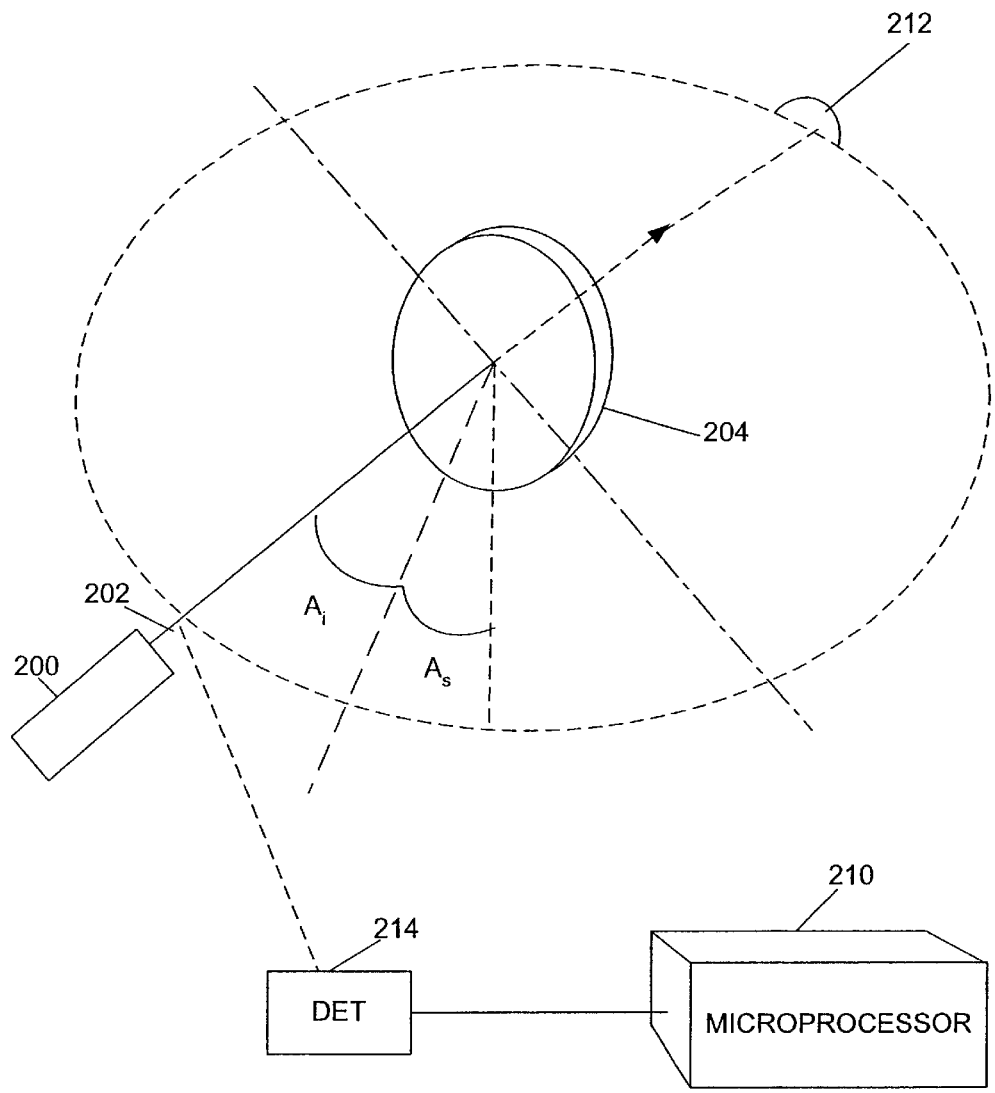
FIG. 10 illustrates an exemplary scatterometry system collecting passed through or transmitted light.

FIG. 10 illustrates an exemplary scatterometry system collecting passed through or transmitted light. The exemplary scatterometry system measures total integrated power in the transmitted zero-order beam. A photodiode 212 of any suitable design is employed. A measurement of the total power incident on the sample is taken via a beam splitter and a detector 214 for the incident beam 202 so that the fraction of total power diffracted into the transmitted zero-order beam can be accurately determined. The current produced in the photodiode 212, and the detector 214, is passed to the microprocessor 210. Thus, light passing through the sample 204 may be accurately calculated.

Figure 11:
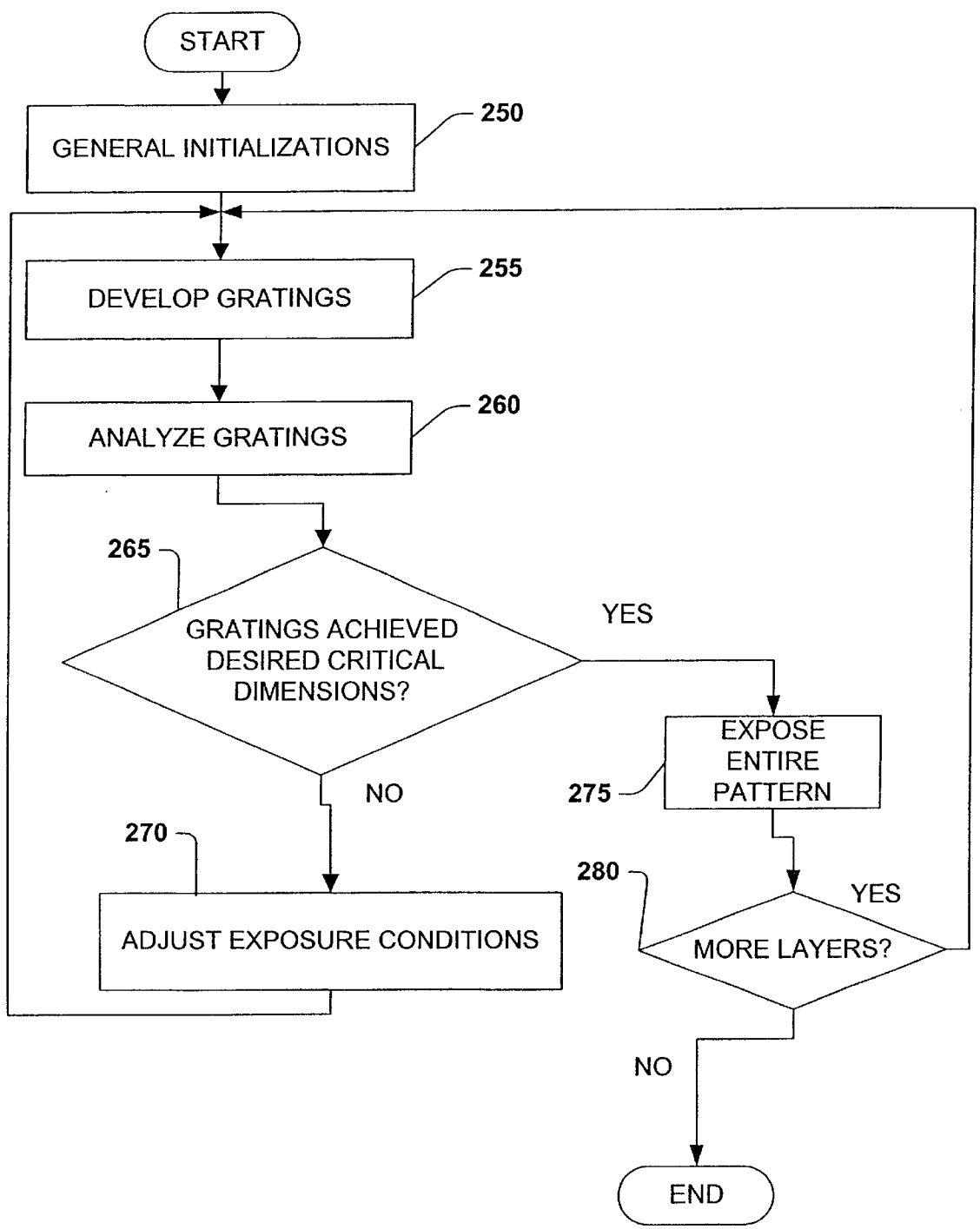
FIG. 11 is a flow diagram illustrating one specific methodology for carrying out the present invention.
Figure 12:
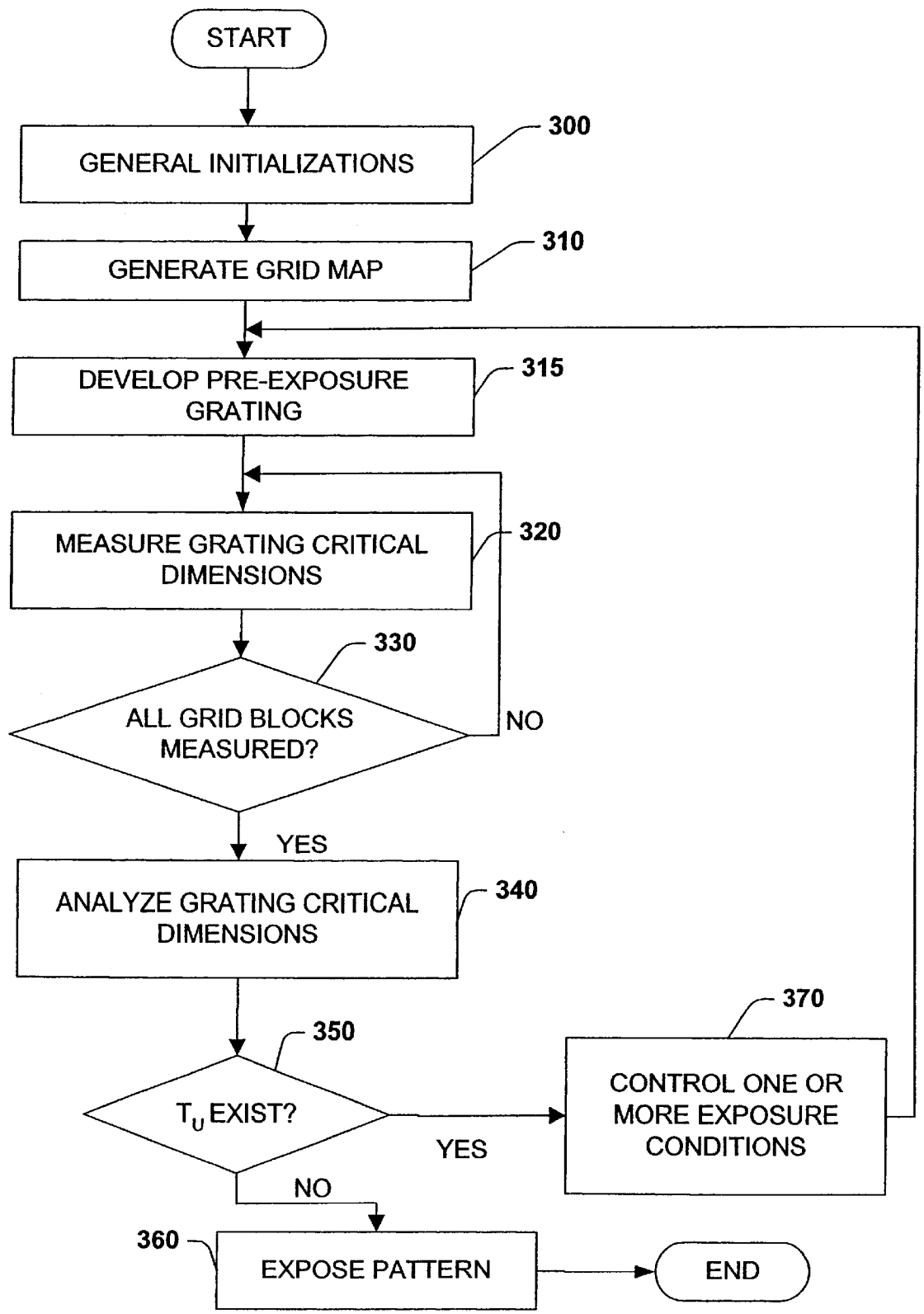
FIG. 12 is a flow diagram illustrating one specific methodology for carrying out an aspect of the present invention.

In view of the exemplary systems shown and described above, methodologies, which may be implemented in accordance with the present invention, will be better appreciated with reference to the flow diagrams of FIG. 11 and FIG. 12. While, for purposes of simplicity of explanation, the methodologies of FIG. 11 and FIG. 12 are shown and described as a series of function blocks, it is to be understood and appreciated that the present invention is not limited by the order of the blocks, as some blocks may, in accordance with the present invention, occur in different orders and/or concurrently with other blocks from that shown and described herein. Moreover, not all illustrated blocks may be required to implement a methodology in accordance with the present invention. It is to be appreciated that the various blocks may be implemented via software, hardware a combination thereof or any suitable means (e.g., device, system, process, component) for carrying out the functionality associated with the blocks. It is also to be appreciated that the blocks are merely to illustrate certain aspects of the present invention in a simplified form and that these aspects may be illustrated via lesser and/or greater number of blocks.

FIG. 11 is a flow diagram illustrating one methodology for carrying out aspects of the present invention. At step 250 general initializations occur. Such initializations can include, but are not limited to, acquiring memory, acquiring resources, establishing data communications, establishing variables and instantiating one or more objects. At step 255 one or more exposure gratings are developed. At step 260, scatterometry techniques are employed to analyze the gratings of step 255. At step 265, a determination is made concerning whether the gratings of step 255 have critical dimensions desired for a pattern to be exposed. If the determination at step 265 is NO, then at step 270, one or more exposure conditions may be adjusted, based, at least in part, in differences between measured grating signatures and desired grating signatures. After such adaptation, another iteration of developing and analyzing gratings begins at step 255. If the determination at step 265 is YES, then at step 275, the pattern can be exposed. At step 280 a determination is made concerning whether more layers requiring more preformed gratings are to be fabricated. If the determination at step 280 is YES, then another iteration of developing and analyzing gratings begins at step 255. If the determination at step 280 is NO, then processing concludes.

FIG. 12 is a flow diagram illustrating one methodology for carrying out aspects of the present invention. In step 300, general initializations are performed. Such initializations can include, but are not limited to, acquiring memory, acquiring resources, establishing data communications, establishing variables and instantiating one or more objects. In step 310, a grid map comprising a plurality of grid blocks "XY" is generated. In step 320, exposure condition signature determinations are made with respect to the various wafer portions mapped by the respective grid blocks XY. At step 315, exposure gratings are exposed. At step 320, scatterometry techniques are employed to measure dimensions achieved in the exposure gratings of step 315. Such techniques can include, but are not limited to, analyzing measured grating signatures. In step 330, a determination is made concerning whether all grid blocks have been measured. If the determination at step 330 is NO, then processing returns to step 320. If the determination at step 330 is YES, then at step 340, one or more grating signatures are compared to acceptable signatures to determine whether desired critical dimensions have been achieved. In step 350, a determination is made concerning whether an unacceptable signature has been encountered. If the determination at step 350 is NO, then at step 360 the pattern can be exposed. If the determination at step 350 is YES, then at step 370, one or more exposure conditions can be adapted to facilitate achieving desired critical dimensions, after which processing returns to step 315.

Scatterometry is a technique for extracting information about a surface upon which an incident light has been directed. Information concerning properties including, but not limited to, dishing, erosion, profile, thickness of thin films and critical dimensions of features present on a surface such as a wafer can be extracted. The information can be extracted by comparing the phase and/or intensity of the light directed onto the surface with phase and/or intensity signals of a complex reflected and/or diffracted light resulting from the incident light reflecting from and/or diffracting through the surface upon which the incident light was directed. The intensity and/or the phase of the reflected and/or diffracted light will change based on properties of the surface upon which the light is directed. Such properties include, but are not limited to, the chemical properties of the surface, the planarity of the surface, features on the surface, voids in the surface, and the number and/or type of layers beneath the surface.

Different combinations of the above-mentioned properties will have different effects on the phase and/or intensity of the incident light resulting in substantially unique intensity/phase signatures in the complex reflected and/or diffracted light. Thus, by examining a signal (signature) library of intensity/phase signatures, a determination can be made concerning the properties of the surface. Such substantially unique phase/intensity signatures are produced by light reflected from and/or refracted by different surfaces due, at least in part, to the complex index of refraction of the surface onto which the light is directed. The complex index of refraction (N) can be computed by examining the index of refraction (n) of the surface and an extinction coefficient (k). One such computation of the complex index of refraction can be described by the equation:

$$N = n - jk$$

where j is an imaginary number.

The signal (signature) library can be constructed from observed intensity/phase signatures and/or signatures generated by modeling and simulation. By way of illustration, when exposed to a first incident light of known intensity, wavelength and phase, a first feature on a wafer can generate a first phase/intensity signature. Similarly, when exposed to the first incident light of known intensity, wavelength and phase, a second feature on a wafer can generate a second phase/intensity signature. For example, a line of a first width may generate a first signature while a line of a second width may generate a second signature. Observed signatures can be combined with simulated and modeled signatures to form the signal (signature) library. Simulation and modeling can be employed to produce signatures against which measured phase/intensity signatures can be matched. In one exemplary aspect of the present invention, simulation, modeling and observed signatures are stored in a signal (signature) library containing over three hundred thousand phase/intensity signatures. Thus, when the phase/intensity signals are received from scatterometry detecting components, the phase/intensity signals can be pattern matched, for example, to the library of signals to determine whether the signals correspond to a stored signature.

Figure 13:
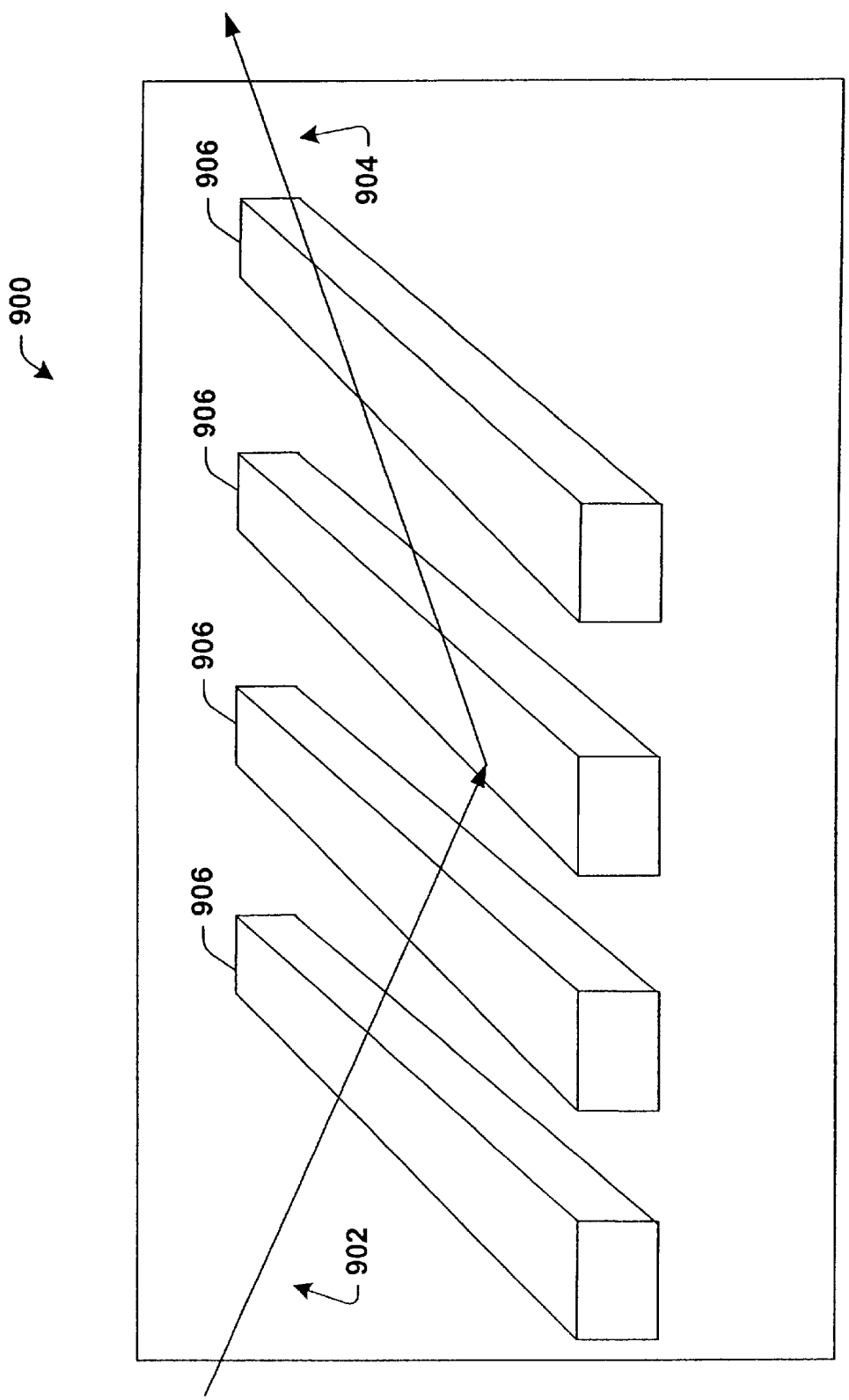
FIG. 13 is a simplified perspective view of an incident light reflecting off a surface, in accordance with an aspect of the present invention.

To illustrate the principles described above, reference is now made to FIGS. 13 through 18. Referring initially to FIG. 13, an incident light 902 is directed at a surface 900, upon which one or more features 906 may exist. In FIG. 13 the incident light 902 is reflected as reflected light 904. The properties of the surface 900, including but not limited to, thickness, uniformity, planarity, chemical composition and the presence of features, can affect the reflected light 904. In FIG. 13, the features 906 are raised upon the surface 900. The phase and intensity of the reflected light 904 can be measured and plotted, as shown, for example, in FIG. 18. The phase 960 of the reflected light 904 can be plotted, as can the intensity 962 of the reflected light 904. Such plots can be employed to compare measured signals with signatures stored in a signature library using techniques like pattern matching, for example.

Figure 14:
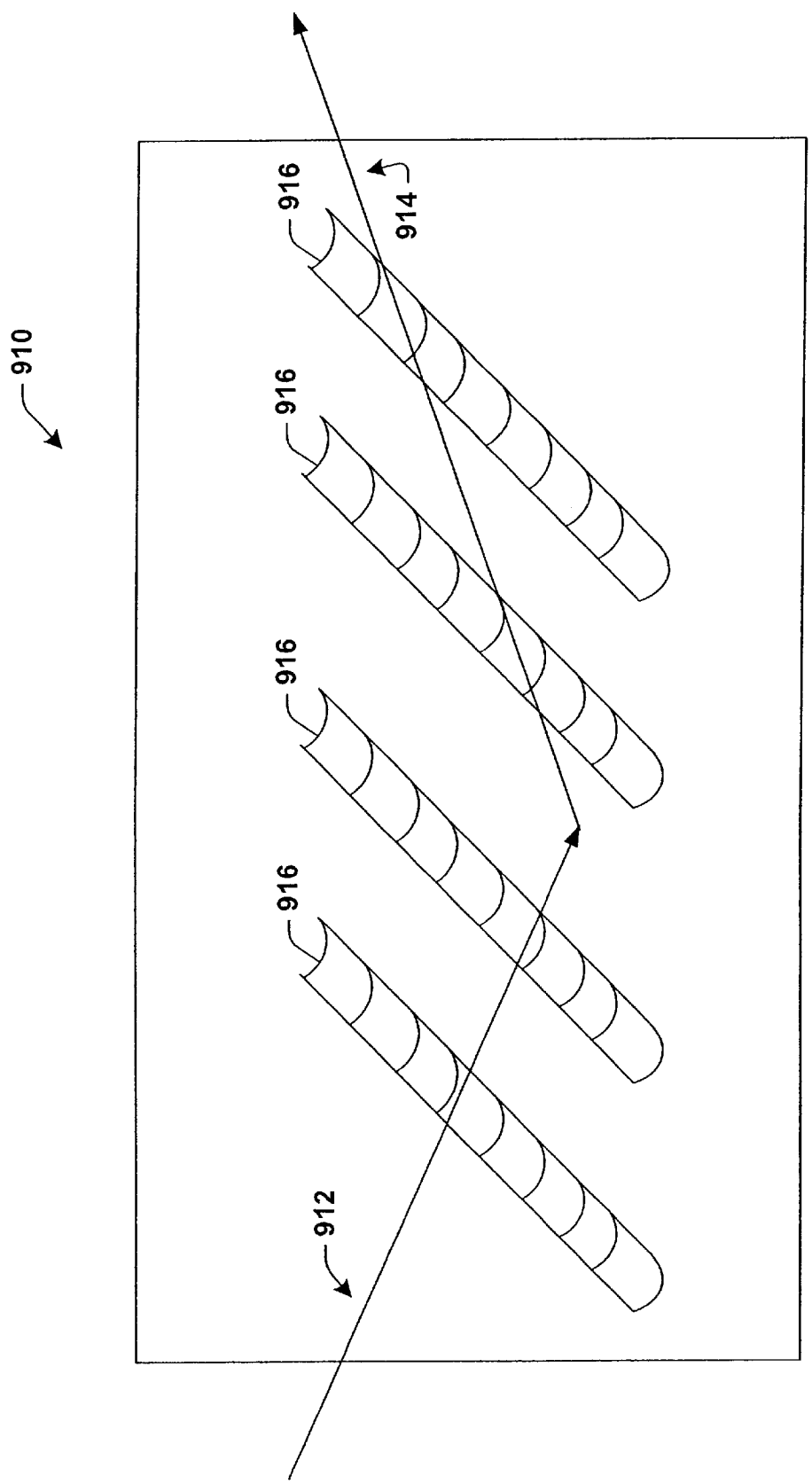
FIG. 14 is a simplified perspective view of an incident light reflecting off a surface, in accordance with an aspect of the present invention.

Referring now to FIG. 14, an incident light 912 is directed onto a surface 910 upon which one or more depressions 916 appear. The incident light 912 is reflected as reflected light 914. Like the one or more features 906 (FIG. 13) may affect an incident beam, so too may the one or more depressions 916 affect an incident beam. Thus, it is to be appreciated by one skilled in the art that scatterometry can be employed to measure features appearing on a surface, features appearing in a surface, and properties of a surface itself, regardless of features.

Figure 15:
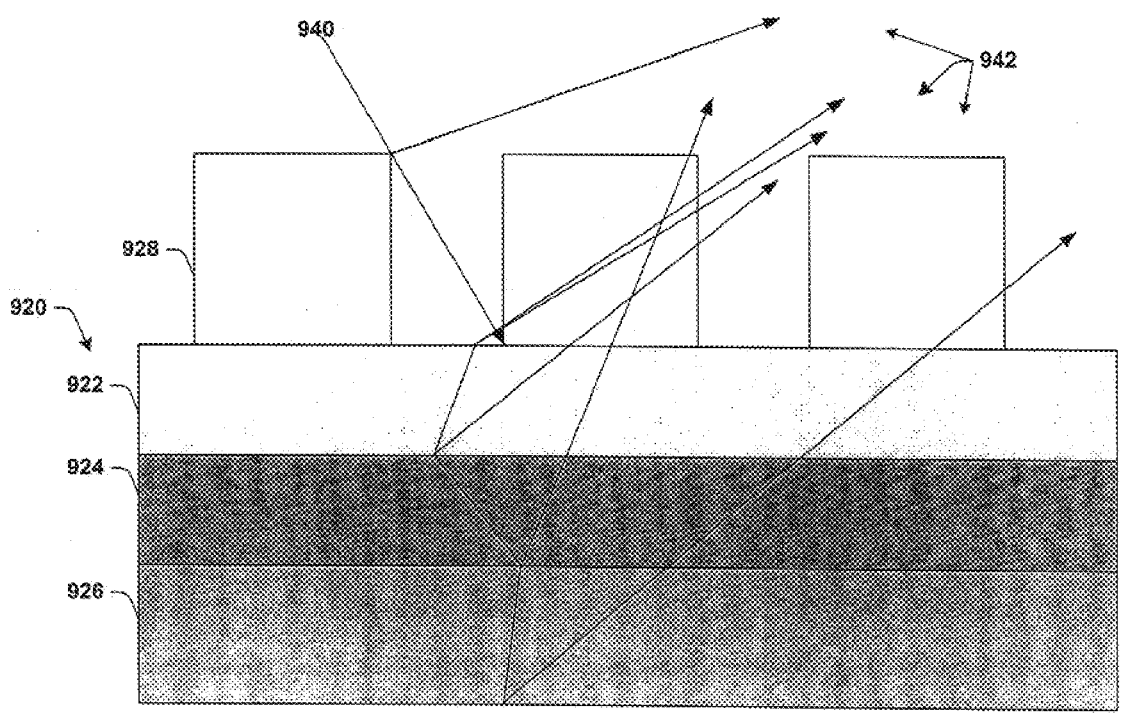
FIG. 15 illustrates a complex reflected and refracted light produced when an incident light is directed onto a surface, in accordance with an aspect of the present invention.

Turning now to FIG. 15, complex reflections and refractions of an incident light 940 are illustrated. The reflection and refraction of the incident light 940 can be affected by factors including, but not limited to, the presence of one or more features 928, and the composition of the substrate 920 upon which the features 928 reside. For example, properties of the substrate 920 including, but not limited to the thickness of a layer 922, the chemical properties of the layer 922, the opacity and/or reflectivity of the layer 922, the thickness of a layer 924, the chemical properties of the layer 924, the opacity and/or reflectivity of the layer 924, the thickness of a layer 926, the chemical properties of the layer 926, and the opacity and/or reflectivity of the layer 926 can affect the reflection and/or refraction of the incident light 940. Thus, a complex reflected and/or refracted light 942 may result from the incident light 940 interacting with the features 928, and/or the layers 922, 924 and 926. Although three layers 922, 924 and 926 are illustrated in FIG. 15, it is to be appreciated by one skilled in the art that a substrate can be formed of a greater or lesser number of such layers.

Figure 16:
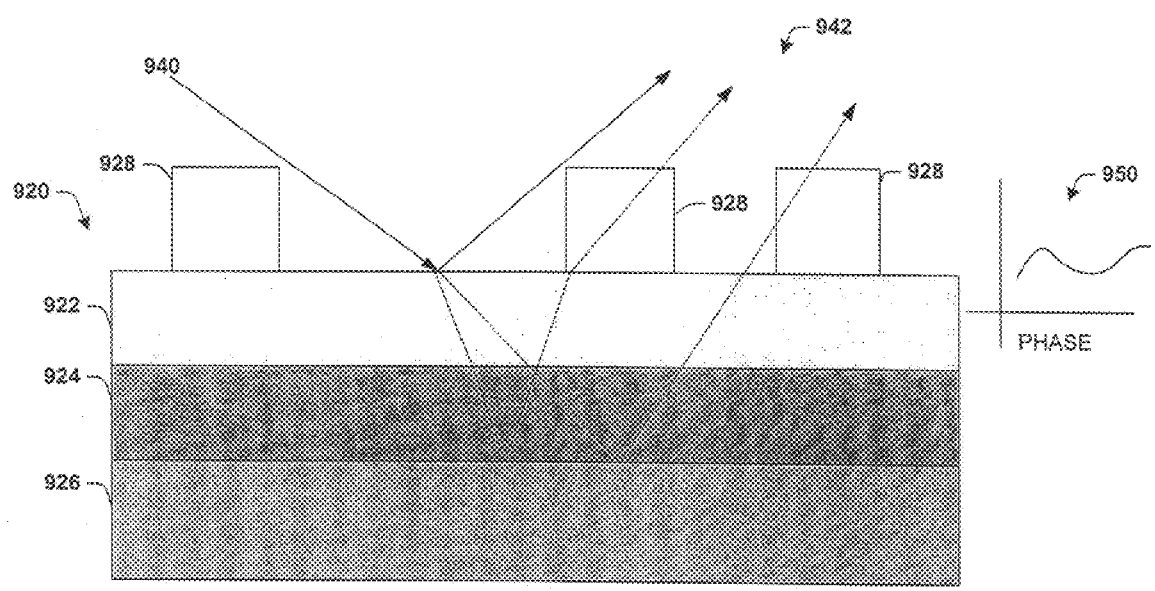
FIG. 16 illustrates a complex reflected and refracted light produced when an incident light is directed onto a surface, in accordance with an aspect of the present invention.
Figure 17:
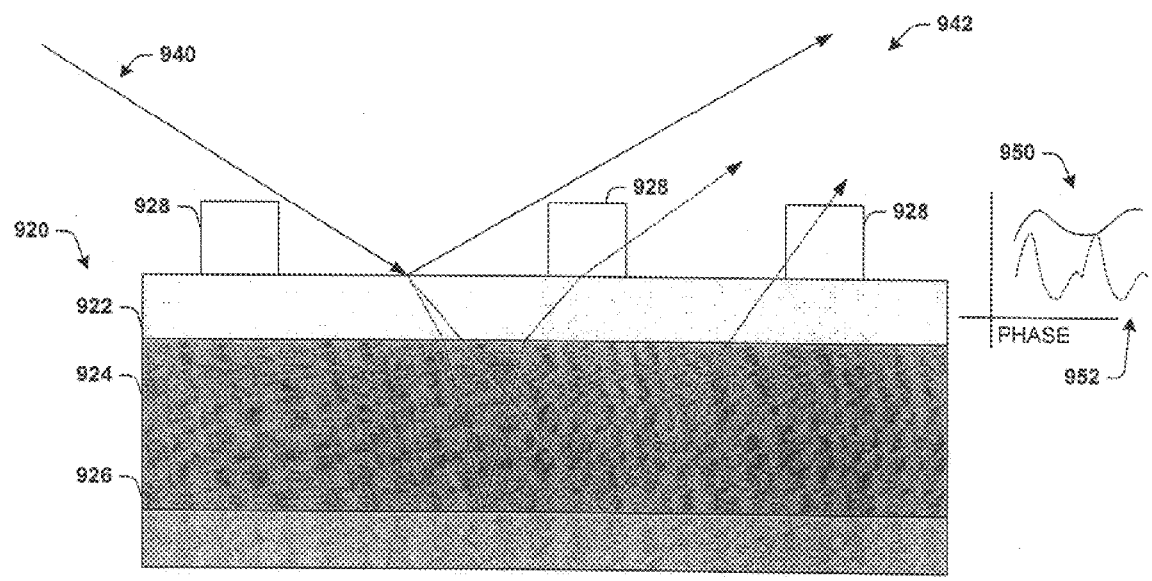
FIG. 17 illustrates a complex reflected and refracted light produced when an incident light is directed onto a surface, in accordance with an aspect of the present invention.
Figure 18:
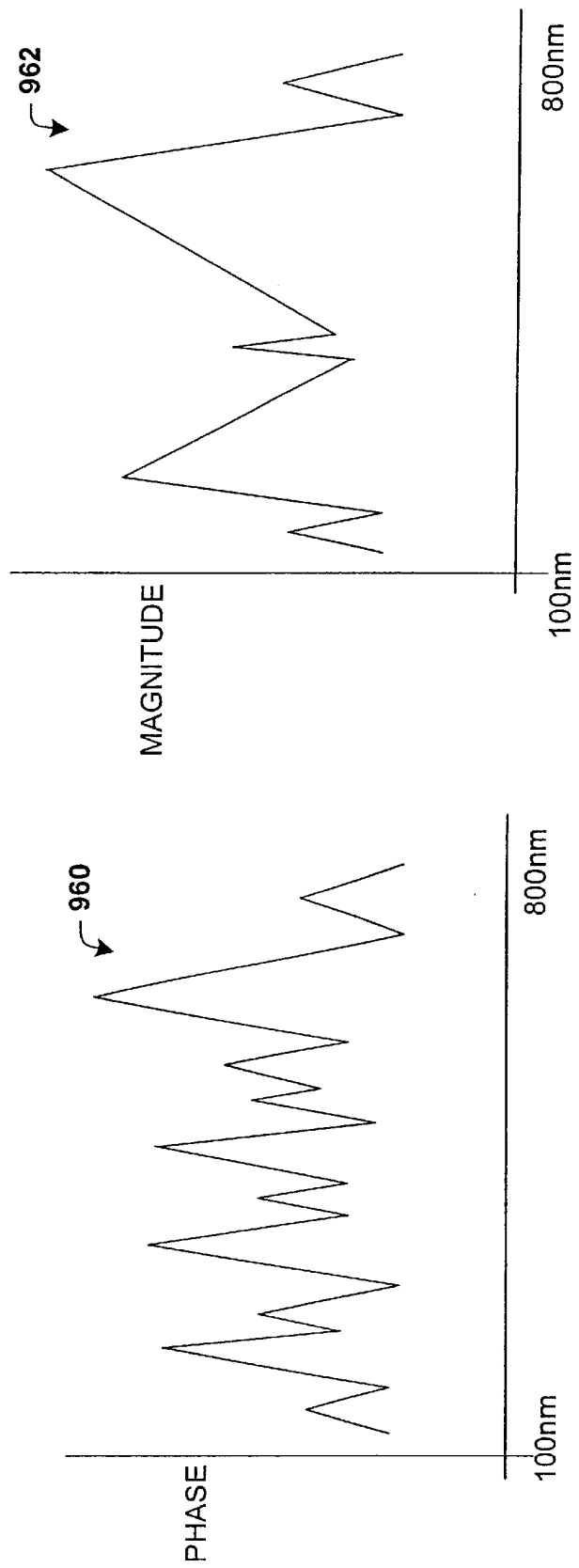
FIG. 18 illustrates phase and intensity signals recorded from a complex reflected and refracted light produced when an incident light is directed onto a surface, in accordance with an aspect of the present invention.

Turning now to FIG. 16, one of the properties from FIG. 15 is illustrated in greater detail. The substrate 920 can be formed of one or more layers 922, 924 and 926.

The phase 950 of the reflected and/or refracted light 942 can depend, at least in part, on the thickness of a layer, for example, the layer 924. Thus, in FIG. 17, the phase 952 of the reflected light 942 differs from the phase 950 due, at least in part, to the different thickness of the layer 924 in FIG. 17.

Thus, scatterometry is a technique that can be employed to extract information about a surface upon which an incident light has been directed. The information can be extracted by analyzing phase and/or intensity signals of a complex reflected and/or diffracted light. The intensity and/or the phase of the reflected and/or diffracted light will change based on properties of the surface upon which the light is directed, resulting in substantially unique signatures that can be analyzed to determine one or more properties of the surface upon which the incident light was directed.

Although the invention has been shown and described with respect to certain aspects, equivalent alterations and modifications will occur to others skilled in the art upon the reading and understanding of this specification and the annexed drawings. In particular regard to the various functions performed by the above described components (systems, devices, assemblies, etc.), the terms used to describe such components are intended to correspond, unless otherwise indicated, to any component which performs the specified function of the described component (i.e., that is functionally equivalent), even though not structurally equivalent to the disclosed structure that performs the function in the herein illustrated exemplary aspects of the invention. In addition, while a particular feature of the invention may have been disclosed with respect to only one of several aspects, such feature may be combined with one or more other features of the other aspects as may be desired and advantageous for any given or particular application. Furthermore, to the extent that the term "includes" is used in either the detailed description and the claims, such term is intended to be inclusive in a manner similar to the term "comprising."

What is claimed is:

1. A system for analyzing and controlling pattern exposure conditions in semiconductor manufacturing, comprising:

an exposing system adapted to expose one or more patterns on one or more layers on a wafer;

an exposer driving system adapted to control one or more exposure conditions in the exposing system;

one or more gratings formed on one or more layers on the wafer;

a light directing system adapted to direct light to at least one portion of the wafer;

a light collecting system adapted to collect a light reflected from the at least one portion of the wafer;

a measuring system adapted to measure one or more grating signatures and generate a grating signature data based on the light reflected from the one or more gratings; and a processor operatively coupled to the measuring system and the exposer driving system, the processor receiving the grating signature data from the measuring system and the processor using the grating signature data to control the exposing system via the exposer driving system to regulate one or more exposure conditions.

2. The system of claim 1, wherein the measuring system further comprises;

a scatterometry system for processing the light reflected from the one or more gratings.

3. The system of claim 2, the processor operatively coupled to the scatterometry system, the processor analyzing data relating to one or more grating signatures received from the scatterometry system, and the processor basing control of the exposing system at least partially on the analyzed data.

4. The system of claim 1, further comprising a measuring system for measuring grating signatures based on a light passing through the one or more gratings.

5. The system of claim 4, wherein the measuring system comprises;

a scatterometry system for processing the light passing through the one or more gratings.

6. The system of claim 5, the processor operatively coupled to the scatterometry system, the processor analyzing data relating to grating signatures received from the scatterometry system, and the processor basing control of the exposing system at least partially on the analyzed data.

7. The system of claim 1, the processor mapping the wafer into a plurality of grid blocks, and making a determination of critical dimensions measured from gratings located in one or more grid blocks.

8. The system of claim 1, wherein the processor determines the existence of an unacceptable grating critical dimension condition for at least a portion of the wafer based upon a determined grating signature differing from an acceptable signature.

9. The system of claim 7, wherein the processor controls the exposing system to regulate one or more exposure conditions.

10. A system for analyzing and controlling pattern exposure conditions in semiconductor manufacturing, comprising:

means for exposing one or more patterns on one or more layers on a wafer;

means for exposing one or more gratings on the wafer;

means for directing light onto at least one portion of the wafer;

means for measuring one or more grating signatures based on a light reflected from the one or more gratings;

means for receiving grating signature data from the measuring means; and means for controlling one or more exposure conditions in the means for exposing the one or more patterns based, at least in part, on the grating signature data.

* * * * *

UNITED STATES PATENT AND TRADEMARK OFFICE
CERTIFICATE OF CORRECTION

PATENT NO.    : 6,602,727 B1
DATED         : August 5, 2003
INVENTOR(S)   : Bharath Rangarajan, Bhanwar Singh and Ramkumar Subramanian It is certified that error appears in the above-identified patent and that said Letters Patent is hereby corrected as shown below:

Column 1,
Line 26, please replace the word "coiners" with the word -- corners --.

Signed and Sealed this

Thirtieth Day of September, 2003

JAMES E. ROGAN
*Director of the United States Patent and Trademark Office*